(12) United States Patent
Hara et al.

(10) Patent No.: US 12,348,001 B2
(45) Date of Patent: *Jul. 1, 2025

(54) LIGHT EMISSION DEVICE

(71) Applicant: NICHIA CORPORATION, Anan (JP)

(72) Inventors: Akinori Hara, Anan (JP); Toshiaki Yamashita, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/333,693

(22) Filed: Jun. 13, 2023

(65) Prior Publication Data

US 2023/0327399 A1 Oct. 12, 2023

Related U.S. Application Data

(63) Continuation of application No. 17/883,243, filed on Aug. 8, 2022, now Pat. No. 11,721,950, which is a
(Continued)

(30) Foreign Application Priority Data

Sep. 20, 2019 (JP) .................... 2019-171453

(51) Int. Cl.
*H01S 5/026* (2006.01)
*G02B 3/04* (2006.01)
(Continued)

(52) U.S. Cl.
CPC ............. *H01S 5/0267* (2013.01); *G02B 3/04* (2013.01); *G02B 27/30* (2013.01); *H01S 5/0087* (2021.01);
(Continued)

(58) Field of Classification Search
CPC ............. H01S 5/0267; H01S 5/32341; H01S 5/02253; H01S 5/02255; H01S 5/4031; H01S 5/0087; G02B 27/30; G02B 19/0066
See application file for complete search history.

(56) References Cited

U.S. PATENT DOCUMENTS 4,030,816 A * 6/1977 Belke ............... G02B 26/0825
359/859
4,884,277 A 11/1989 Anthon et al.
(Continued)

FOREIGN PATENT DOCUMENTS

CN 114815276 A * 7/2022
JP 2012-018208 A 1/2012
(Continued)

OTHER PUBLICATIONS

Non-Final Office Action in U.S. Appl. No. 17/016,202 dated Feb. 15, 2022.
(Continued)

*Primary Examiner* — Xinning (Tom) Niu
(74) *Attorney, Agent, or Firm* — Foley & Lardner LLP

(57) ABSTRACT

A light emission device includes: a plurality of semiconductor light-emitting elements; an optical element configured to collimate light emitted from each of the plurality of semiconductor light-emitting elements and output a plurality of collimated beams; and a paraboloid reflector configured to be irradiated with the plurality of collimated beams. The plurality of collimated beams reflected by the paraboloid reflector are converged.

14 Claims, 12 Drawing Sheets

Related U.S. Application Data continuation-in-part of application No. 17/016,202, filed on Sep. 9, 2020, now Pat. No. 11,444,430.

(51) Int. Cl.
    *G02B 27/30*      (2006.01)
    *H01S 5/00*      (2006.01)
    *H01S 5/02212*      (2021.01)
    *H01S 5/02253*      (2021.01)
    *H01S 5/02255*      (2021.01)
    *H01S 5/40*      (2006.01)

(52) U.S. Cl.
    CPC ...... *H01S 5/02212* (2013.01); *H01S 5/02253* (2021.01); *H01S 5/02255* (2021.01); *H01S 5/4025* (2013.01)

(56) References Cited

U.S. PATENT DOCUMENTS

| | | | |
|---|---|---|---|
| 6,538,817 | B1 | 3/2003 | Farmer et al. |
| 10,606,092 | B1* | 3/2020 | Lauer ..................... G02B 30/27 |
| 2002/0166893 | A1 | 11/2002 | Li et al. |
| 2007/0291804 | A1* | 12/2007 | Day ........................ G02B 3/00 |
| | | | 372/36 |
| 2012/0008098 | A1 | 1/2012 | Akiyama |
| 2012/0236264 | A1 | 9/2012 | Akiyama |
| 2012/0281293 | A1* | 11/2012 | Gronenborn et al. .. H01S 5/423 |
| | | | 359/619 |
| 2013/0259423 | A1 | 10/2013 | Charbonneau-Lefort |
| 2014/0008690 | A1 | 1/2014 | Funayama et al. |
| 2014/0139810 | A1 | 5/2014 | Matsubara |
| 2014/0268787 | A1* | 9/2014 | Nozaki ............... H01S 5/02469 |
| | | | 362/259 |
| 2016/0186936 | A1* | 6/2016 | Kiyota .................. H01S 5/0087 |
| | | | 29/447 |
| 2017/0371110 | A1* | 12/2017 | Cheng .................. H04B 10/503 |
| 2018/0210211 | A1 | 7/2018 | Akiyama |

FOREIGN PATENT DOCUMENTS

| | | | |
|---|---|---|---|
| JP | 2012-118302 | A | 6/2012 |
| JP | 2012-195064 | A | 10/2012 |
| JP | 2014-102367 | A | 6/2014 |
| JP | 2014-179504 | A | 9/2014 |
| JP | 2016-219779 | A | 12/2016 |
| JP | 2017-107776 | A | 6/2017 |
| JP | 2017-134323 | A | 8/2017 |
| JP | 2018-120111 | A | 8/2018 |
| JP | 2018-138949 | A | 9/2018 |
| JP | 2019-066626 | A | 4/2019 |
| JP | 2019-102406 | A | 6/2019 |
| WO | WO-2012/004959 | A1 | 1/2012 |
| WO | WO-2012/124302 | A1 | 9/2012 |

OTHER PUBLICATIONS

Non-Final Office Action in U.S. Appl. No. 17/883,243 dated Dec. 7, 2022.

* cited by examiner

LIGHT EMISSION DEVICE

CROSS REFERENCE TO RELATED APPLICATION

This application is a continuation of U.S. patent application Ser. No. 17/883,243, filed on Aug. 8, 2022, which is a continuation of U.S. patent application Ser. No. 17/016,202, filed on Sep. 9, 2020 (now U.S. Pat. No. 11,444,430), which claims priority to Japanese Patent Application No. 2019-171453, filed on Sep. 20, 2019. The entire contents of these applications are hereby incorporated by reference.

BACKGROUND

The present disclosure relates to a light emission device.

A number of light emission devices have been proposed that emit mixed light that is obtained through mixing of light emitted from a semiconductor light-emitting element and fluorescence emitted from a phosphor. In such a light emission device, for example, blue light that is emitted from a semiconductor light-emitting element is used to excite a phosphor that emits yellow fluorescence, thereby providing white mixed light through mixing of the blue light passing through the phosphor-containing portion and the yellow fluorescence emitted from the phosphor (see, for example, International Publication No. 2012/124302).

SUMMARY

When a phosphor is irradiated with light that is emitted from a semiconductor light-emitting element, color unevenness may exist in the mixed light resulting through mixing of the light (from the semiconductor light-emitting element) passing through the phosphor-containing portion and the fluorescence emitted from the phosphor.

In one embodiment, a light emission device according to the present disclosure includes: a plurality of semiconductor light-emitting elements; an optical element configured to collimate light emitted from each of the plurality of semiconductor light-emitting elements and output a plurality of collimated beams; a converging portion having an aspheric surface configured to converge the plurality of collimated beams; and a wavelength-converting portion including a transmissive region and a reflective region that surrounds the transmissive region, the transmissive region including a light-incident surface at which the plurality of collimated beams enter. The transmissive region includes a phosphor to be excited by the plurality of collimated beams having been converged by the converging portion.

According to certain embodiments of the present disclosure, there is provided a light emission device that suppresses color unevenness existing in mixed light that is obtained through mixing of light that is emitted from semiconductor light-emitting elements and fluorescence that is emitted from a phosphor.

DETAILED DESCRIPTION

Spectrum of Fluorescence

Prior to describing embodiments of the present disclosure, an exemplary spectrum of fluorescence that is emitted from a phosphor that is excited by light (excitation light) having a narrow spectral width, e.g., laser light, will be discussed.

Figure 9:
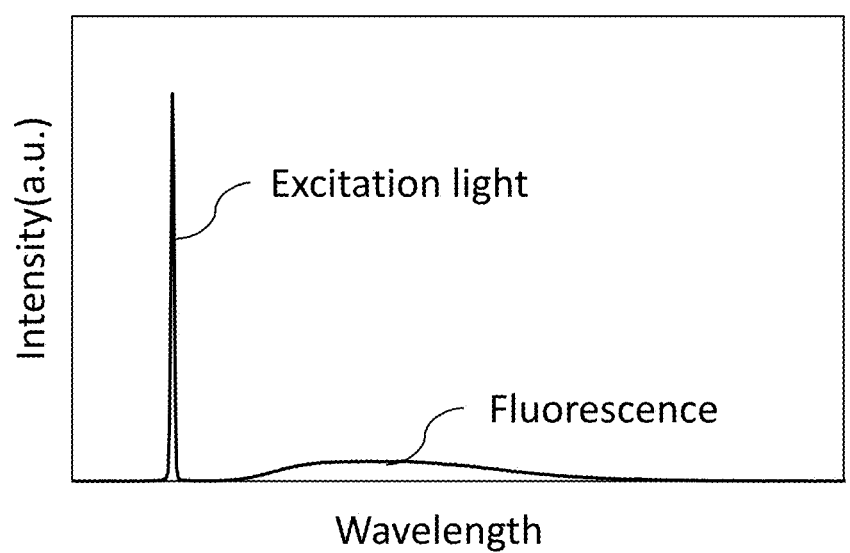
FIG. 9 is a diagram schematically showing a spectrum of excitation light of a single wavelength, and a spectrum of resultant fluorescence.

FIG. 9 is a diagram schematically showing a spectrum of excitation light, and a spectrum of resultant fluorescence. As shown in FIG. 9, while the excitation light has a narrow spectral width, the fluorescence has a broad spectral width. The fluorescence spectrum spans a region of longer wavelengths than the excitation light wavelength. In practice, when a phosphor is irradiated with excitation light, a portion of the excitation light will excite the phosphor, while the remainder will be transmitted through the phosphor, reflected by the phosphor, etc., so as to exit the portion containing phosphor without undergoing any wavelength conversion. The resultant light will be light in which the excitation light having been transmitted through the phosphor and the fluorescence emitted from the phosphor are mixed. For example, when a YAG (Yttrium Aluminum Garnet) phosphor is excited by blue laser light having a wavelength of 455 nm, this phosphor will emit yellow fluorescence. The blue laser light having been transmitted the phosphor and the yellow fluorescence emitted from the phosphor will mix together to provide white light. This white mixed light can be utilized in a lighting device, for example. Although white may be a representative color of mixed light, this is not a limitation; the color of mixed light can be adjusted based on the combination of the excitation light and the phosphor.

Findings Serving as the Basis of Embodiments of the Present Disclosure

Next, with reference to FIGS. 1A through 1C, findings serving as the basis of embodiments of the present disclosure will be described. A phosphor may be employed in the following manner in a context where the phosphor is irradiated with excitation light, for the purpose of obtaining mixed light that contains excitation light having been transmitted through the phosphor and fluorescence emitted from the phosphor.

Figure 1A:
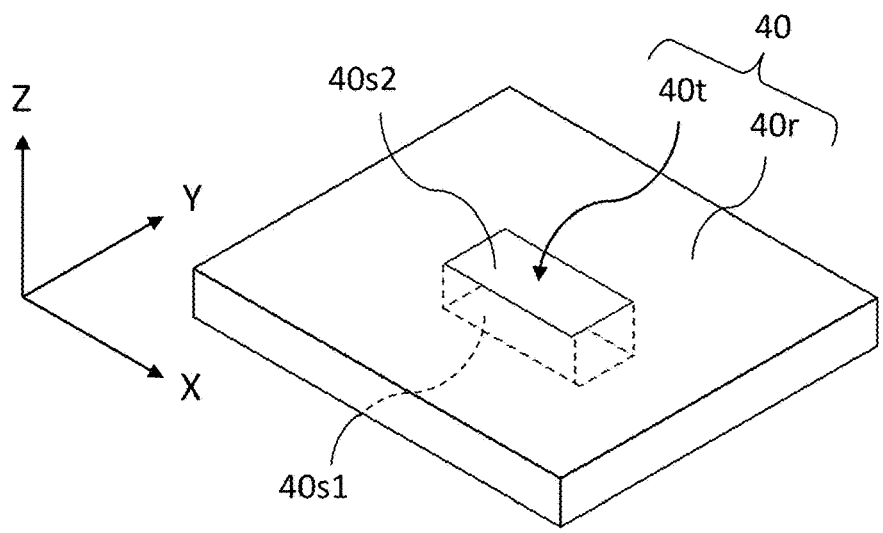
FIG. 1A is a perspective view schematically showing a wavelength-converting portion that includes: a transmissive region including a phosphor; and a reflective region surrounding the transmissive region.

FIG. 1A is a perspective view schematically showing a wavelength-converting portion 40 that includes: a transmissive region 40$t$ including a phosphor; and a reflective region 40$r$ surrounding the transmissive region 40$t$. The transmissive region 40$t$ includes a light-incident surface 40$s$1 and a light-outgoing surface 40$s$2, which are both exposed and are parallel to each other. The transmissive region 40$t$ may be a ceramic in which a phosphor is contained, i.e., a phosphor ceramic. Fluorescence that is emitted from the phosphor is substantially non-distributed light. Therefore, within the phosphor ceramic, a portion of the fluorescence goes toward the reflective region 40$r$ and is reflected by the reflective region 40$r$. A phosphor ceramic may be made of a binder of an inorganic material and a phosphor, for example. The reflective region 40$r$ may be made of a ceramic, for example. In the example shown in FIG. 1A, the transmissive region 40$t$ is made by using a YAG phosphor and a binder material of aluminum oxide as the main materials, whereas the reflective region 40$r$ is made of aluminum oxide as the main material. The transmissive region 40$t$ and the reflective region 40$r$ exhibit high adhesion with each other, because they both contain aluminum oxide.

As an excitation light source for exciting the YAG phosphor contained in the transmissive region 40$t$, for example, a semiconductor laser package that emits a plurality of blue collimated beams may be used. The plurality of collimated beams may be converged with one condenser lens, and the beams having been converged may be used to irradiate the light-incident surface 40$s$1 of the transmissive region 40$t$, whereby mixed light can be obtained. A "collimated beam" refers to a beam that has been collimated so that its beam diameter remains constant along the traveling direction of the beam. However, the beam diameter may not be strictly constant in some cases. Moreover, when a collimated beam is converged with a condenser lens, its beam diameter will gradually narrow, and after becoming smallest at the beam waist, again broaden gradually. In the present specification, for ease of explanation, the term "collimated beam" encompasses a collimated beam that has also been transmitted through a condenser lens.

Figure 1B:
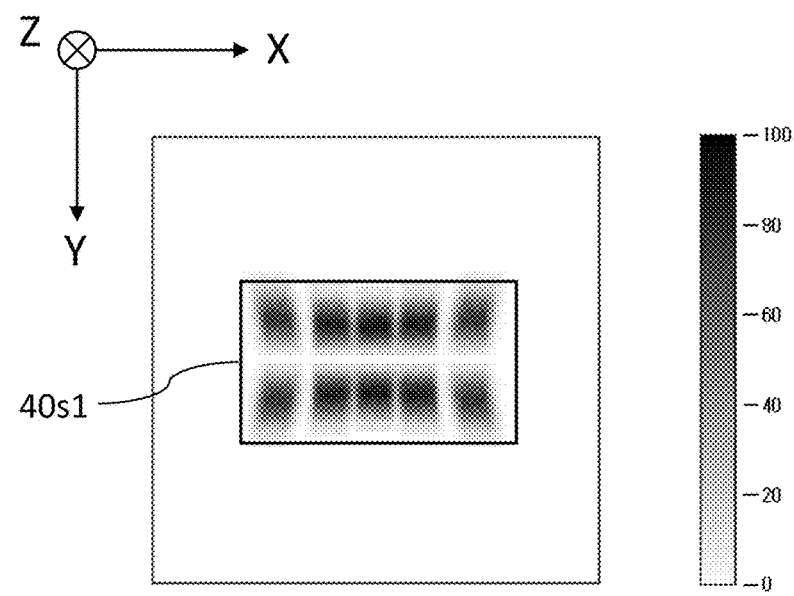
FIG. 1B is a diagram showing a result of intensity distribution calculation, on a light-incident surface of the transmissive region, for two rows by five columns of collimated beams that have been converged by a spherical lens.

FIG. 1B is a diagram showing a result of an intensity distribution calculation, on the light-incident surface 40$s$1 of the transmissive region 40$t$, for two rows by five columns of radiated collimated beams that have been converged by a spherical lens. FIG. 1B illustrates relative intensities of light in varying degrees of shading, where white corresponds to 0% and black corresponds to 100%. In the following description, a mere reference to an "intensity distribution of radiated collimated beams" alludes to an intensity distribution of collimated beams that are radiated on the transmissive region 40$t$ and observed at the light-incident surface 40$s$1. Specific conditions of calculation will be described later. The region surrounded in a black rectangular frame represents the light-incident surface 40$s$1 of the transmissive region 40$t$. The light-incident surface 40$s$1 of the transmissive region 40$t$ is located away from the focusing point of any of the collimated beams that are converged by the spherical lens. As shown in FIG. 1B, mainly the central portion of the light-incident surface 40$s$1 of the transmissive region 40$t$ is irradiated. The plurality of collimated beams will become more divergent away from the center. In the example shown in FIG. 1B, however, the degree of divergence is not large, and end portions of the light-incident surface 40$s$1, in particular the four corners, are barely irradiated. Being excited by the collimated beams that are incident on the transmissive region 40$t$, the phosphor emits fluorescence. Therefore, from the light-outgoing surface 40$s$2 of the transmissive region 40$t$, white light should ideally be emitted, into which blue light passing through the transmissive region 40$t$ and the yellow fluorescence emitted from the YAG phosphor have been mixed together. However, in practice, this mixed light may have some color unevenness.

Figure 1C:
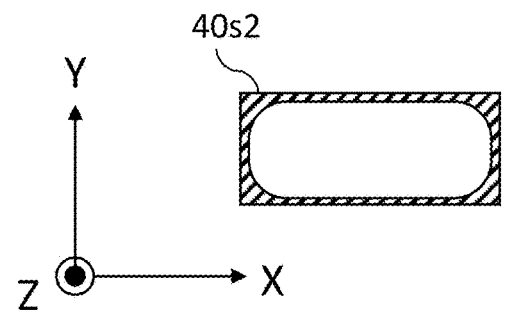
FIG. 1C is a diagram schematically showing a chromatic distribution of mixed light emitted from a light-outgoing surface of the transmissive region.

FIG. 1C is a diagram schematically showing a chromatic distribution of mixed light emitted from the light-outgoing surface 40$s$2 of the transmissive region 40$t$. A white region represents a region where white light is emitted, whereas a hatched region represents a region where more yellowish light is emitted. It can be seen that white light is predominantly emitted from the central portion of the light-outgoing surface 40$s$2 of the transmissive region 40$t$, while relatively yellowish light is emitted at the end portions, in particular the four corners, thus resulting in substantial color unevenness. A possible reason for this is as follows. Portions of the fluorescence emitted at locations that are irradiated with four collimated beams incident at the ends of the row direction (the X direction) travel toward the reflective region 40$r$, and after being reflected back from the reflective region 40$r$, exit the light-outgoing surface 40$s$2. At each corner of the reflective region 40$r$, fluorescence is reflected from two planes that are perpendicular to each other. This results in a greater proportion of yellow light existing than there is blue light, whereby the mixed light becomes yellowish at the end portions, in particular the four corners, of the light-outgoing surface 40$s$2 of the transmissive region 40$t$.

The inventors have ascribed the reasons for the color unevenness to the intensity distribution of radiated collimated beams at the light-incident surface of the transmissive region, thereby arriving at a novel light emission device that can reduce color unevenness. This light emission device includes a converging portion having an aspheric surface that converges a plurality of collimated beams that are emitted from light sources. The shape of this aspheric surface is appropriately designed so that the intensity distribution of radiated collimated beams having been converged thereby will allow color unevenness in the mixed light to be reduced. Details of the converging portion will be described later.

EMBODIMENTS

Embodiments of the present disclosure will now be described with reference to the drawings. It should be understood that the implementations described below are merely embodiments of the technological concept of the present invention, and do not limit the present invention. Furthermore, in the following description, any identical name or identical reference numeral indicates an identical or similar element, of which repeated detailed description may be omitted. Note that the size, relative positioning, and the like of any element that is depicted in a drawing may be exaggerated for clarity of explanation.

In the present specification, when an element is directly disposed on a surface, or when an element is directly disposed on another object that is directly disposed on the surface, the element is said to have been "disposed on the surface." In other words, when an element is disposed on or above the surface, such that the element is physically coupled with the surface, with or without an intermediate object in between, the element is said to be disposed on the surface. Note that, whenever it is specifically meant that the element is directly disposed on the surface, the term "directly" will be consistently used. When there is no explicit reference to the element being "directly disposed," it is meant that the manner of placement may be either direct or indirect.

Example Configuration of Light Emission Device

First, with reference to FIGS. 2A through 2D, an example configuration of a light emission device according to an embodiment of the present disclosure will be described.

Figure 2A:
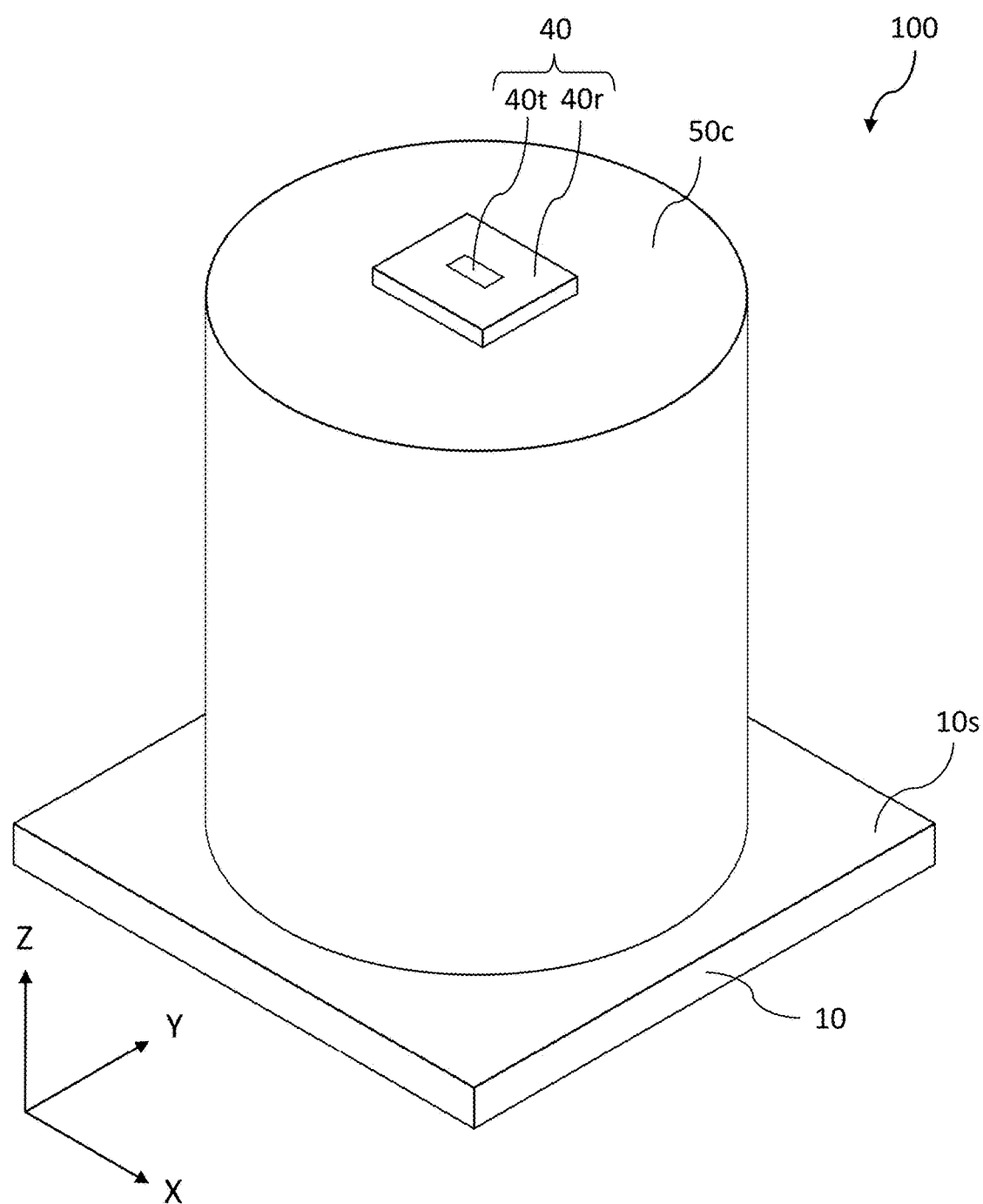
FIG. 2A is a perspective view schematically showing a light emission device according to an embodiment of the present disclosure.
Figure 2B:
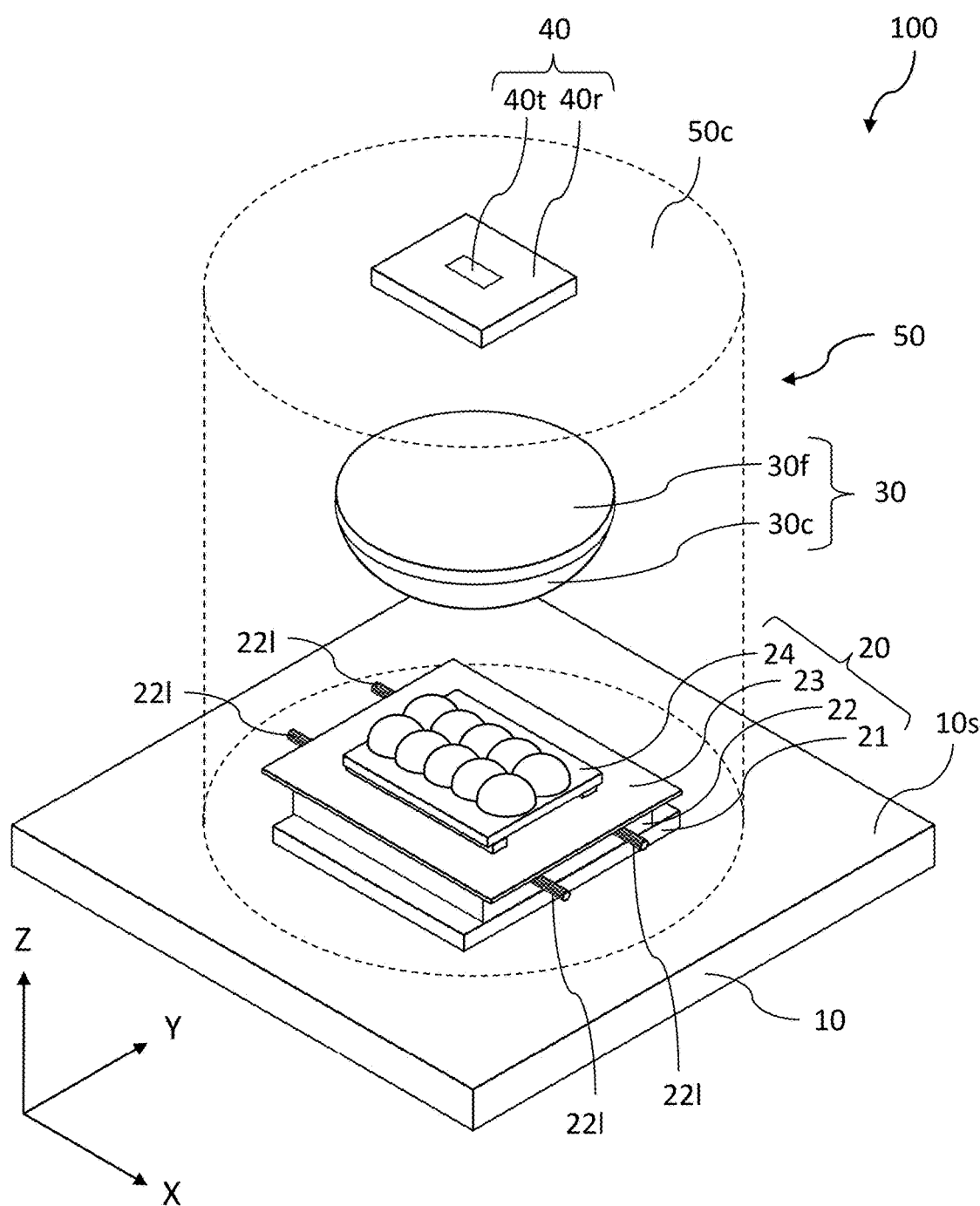
FIG. 2B is a perspective view schematically showing the inside of the light emission device depicted in FIG. 2A.

FIG. 2A is a perspective view schematically showing a light emission device 100 according to an embodiment of the present disclosure. FIG. 2B is a perspective view schematically showing the inside of the light emission device 100 depicted in FIG. 2A. In FIG. 2B, an outer shape of the housing 50 is indicated by a broken line. For reference, the drawings illustrate the X direction, the Y direction, and the Z direction, which are orthogonal to one another.

The light emission device 100 according to the present embodiment includes: a substrate 10 having a principal face 10s; a light source 20 disposed on the principal face 10s, the light source 20 being configured to emit two rows by five columns of collimated beams; an aspherical lens 30 having a convex portion 30c configured to converge collimated beams; a wavelength-converting portion 40 having a transmissive region 40t on an optical axis of the aspherical lens 30; and a housing 50 in which the light source 20 and the aspherical lens 30 are housed. The row direction is parallel to the X direction, whereas the column direction is parallel to the Y direction. In the present specification, the word "above" or "upward" refers to, relative to where the principal face 10s of the substrate 10 is, the direction in which the light source 20 is disposed. The actual orientation of the light emission device 100 during use may be arbitrarily selected.

The substrate 10 in the present embodiment may have the principal face 10s being parallel to the XY plane, and its thickness may extend along the Z direction, for example. The substrate 10 is desirably made of a material having a relatively high thermal conductivity in order to allow heat that is emitted from the light source 20 to be quickly released to the outside. The substrate 10 may have a thermal conductivity of e.g. 20 W/mK or more. Examples of main materials for the substrate 10 include, for example: metals, such as Cu, Al, Fe, Ni, and Mo; and ceramics, such as aluminum nitride and carbon nitride.

The light source 20 in the present embodiment includes: a base part 21; semiconductor light-emitting elements that are disposed in two rows by five columns on a principal face of the base part 21; a frame body 22 being provided on the principal face of the base part 21 and having lead terminals 221 that, as a whole, surround the semiconductor light-emitting elements; a lid 23 provided on a frame that is created by the frame body 22; and an optical element 24 provided on the lid 23. The optical element 24 collimates light that is emitted from the semiconductor light-emitting elements disposed in two rows by five columns within the light source 20, and outputs the two rows by five columns of collimated beams in a direction parallel to the optical axis of the aspherical lens 30 (the Z direction). The traveling directions of these collimated beams are generally parallel to one another; however, their traveling directions do not need to be strictly parallel. In the present specification, being "parallel" is not limited to being "parallel" in the strictly mathematical sense. In the present specification, "parallel" allows for a discrepancy of 1.5 degrees or less from strict parallelism, for example. So long as there are discrete collimated beams, it is possible to irradiate the phosphor-containing transmissive region 40t with a plurality of collimated beams. In the case where the transmissive region 40t of the wavelength-converting portion 40 contains a YAG phosphor, the wavelength of blue collimated beams may be not less than 420 nm and not more than 480 nm, for example. The wavelength of the collimated beams may be selected in accordance with the type of phosphor. The sizes of the light source 20 along the X direction and along the Y direction may be e.g. not less than 25 mm and not more than 35 mm, whereas the thickness of the light source 20 along the Z direction may be e.g. not less than 10 mm and not more than 15 mm. Details of the light source 20 will be described later.

The aspherical lens 30 in the present embodiment may be a planoconvex lens including a convex portion 30c and a plate portion 30f, for example. The convex portion 30c and the plate portion 30f may have a refractive index of e.g. not less than 1.4 and not more than 2.1. Although the convex portion 30c is shown to be provided at the side where the collimated beams are incident, it may be provided at the side opposite to the side where the collimated beams are incident. The plate portion 30f may not even be provided. In the example shown in FIG. 2B, the convex portion 30c is shown to be thicker than the plate portion 30f, the plate portion 30f may alternatively be thicker than the convex portion 30c. A "converging portion having an aspheric surface," in the meaning of the present disclosure, may be the aspherical lens 30, for example.

The convex portion 30c and/or the plate portion 30f of the aspherical lens 30 may be made of at least one of glass, quartz, and sapphire, for example. The sizes of the aspherical lens 30 along the X direction and along the Y direction may be e.g. not less than 2 mm and not more than 200 mm, and the thickness of the aspherical lens 30 along the Z direction may be e.g. not less than 2 mm and not more than 150 mm. The shape of the aspherical lens 30 in upper plan view, i.e., its shape as viewed along the Z direction, may be a circle, for example. The interspace between the light source 20 and the aspherical lens 30 along the Z direction may be e.g. not less than 1 mm and not more than 300 mm. Details of the aspheric shape of the surface of the convex portion 30c of the aspherical lens 30 will be described later.

The wavelength-converting portion 40 in the present embodiment has been described with reference to FIG. 1A. Although the light-incident surface 40s1 of the transmissive region 40t is shown to have a rectangular shape, it may alternatively have a polygon, a circle, an ellipse, or any similar shape thereto.

The transmissive region 40t of the wavelength-converting portion 40 contains a YAG phosphor that is excited by blue light to emit yellow fluorescence; however, this is not a limitation. For example, the transmissive region 40t may contain a first phosphor that is excited by blue light to emit yellow or green fluorescence and a second phosphor that is excited by blue light to emit red fluorescence. By irradiating the light-incident surface 40s1 of the transmissive region 40t as such with blue light, white mixed light can be obtained from the light-outgoing surface 40s2 of the transmissive region 40t.

Instead of aluminum oxide, the reflective region 40r of the wavelength-converting portion 40 may be made of zirconium oxide or titanium oxide as the main material. In order to reduce light transmittance, the reflective region 40r may contain an additive(s) such as yttrium oxide, zirconium oxide, lutetium oxide, and/or lanthanum oxide. In the case where the reflective region 40r is a ceramic, light reflectance tends to improve as the reflective region 40r has a higher porosity. Therefore, within the reflective region 40r, porosity may be increased around the transmissive region 40t than in any portions outside thereof. This will allow the fluorescence that is emitted in the transmissive region 40t and that heads toward the reflective region 40r to be efficiently reflected by the reflective region 40r. The reflective region 40r may also have the function of allowing the heat that is emitted in the transmissive region 40t in response to collimated beam irradiation to be released outside. This will alleviate deteriorations of the phosphor in the transmissive region 40t. The main material of the reflective region 40r may be a ceramic or a metal. The wavelength-converting portion 40 may at least include the transmissive region 40t, and the reflective region 40r is not needed.

In order to efficiently release heat to the outside, the wavelength-converting portion 40 may further include a heat sink member on at least one of its upper surface and lower surface. Presence of a non-zero interspace between the wavelength-converting portion 40 and the heat sink member will cause a decrease in the heat-releasing ability; therefore, grease, a dielectric film, or any other member may be provided in order to fill the interspace between the wavelength-converting portion 40 and the heat sink member.

At the light-incident surface 40s1 side of the transmissive region 40t, the wavelength-converting portion 40 may further include a filter that transmits the collimated beams but that reflects the fluorescence that is emitted from the phosphor. This can restrain the fluorescence from being emitted toward the aspherical lens 30, and thus allow the fluorescence to be efficiently emitted from the light-outgoing surface 40s2 of the transmissive region 40t. The filter may be made of a multilayer film of dielectric in which high-refractive index layers and low-refractive index layers alternate, for example. The multilayer film of dielectric is able to reflect light in a specific wavelength region by substantially 100%, while transmitting any other light. The multilayer film of dielectric may be designed so that this specific wavelength region contains a part or a whole of the wavelength spectrum of the fluorescence.

The sizes of the transmissive region 40t of the wavelength-converting portion 40 along the X direction and along the Y direction may be e.g. not less than 0.5 μm and not more than 100 μm, and the thickness of the transmissive region 40t along the Z direction may be e.g. not less than 0.1 mm and not more than 10 mm. The interspace between the aspherical lens 30 and the wavelength-converting portion 40 along the Z direction may be e.g. not less than 1 mm and not more than 300 mm. In the present specification, an "interspace between component parts" is synonymous with the minimum distance between the component parts.

The housing 50 in the present embodiment may have the shape of a cylindrical tube having a circular cross section, for example. Alternatively, the housing 50 may have the shape of a rectangular tube having a polygonal cross section, or the shape of a dome. The height of the housing 50 along the Z direction is determined by a sum of: the thickness of the light source 20; the interspace between the light source 20 and the aspherical lens 30; the thickness of the aspherical lens 30; and the interspace between the aspherical lens 30 and the wavelength-converting portion 40. Without being limited to this, the relationship between the height of the housing 50 along the Z direction and dimensions associated with other component parts may be adjusted as appropriate. For example, any other component parts than these may be housed in the housing 50. A reflector, etc., may be disposed to alter the traveling direction of the collimated beams 20b at a certain point along its path.

Figure 3A:
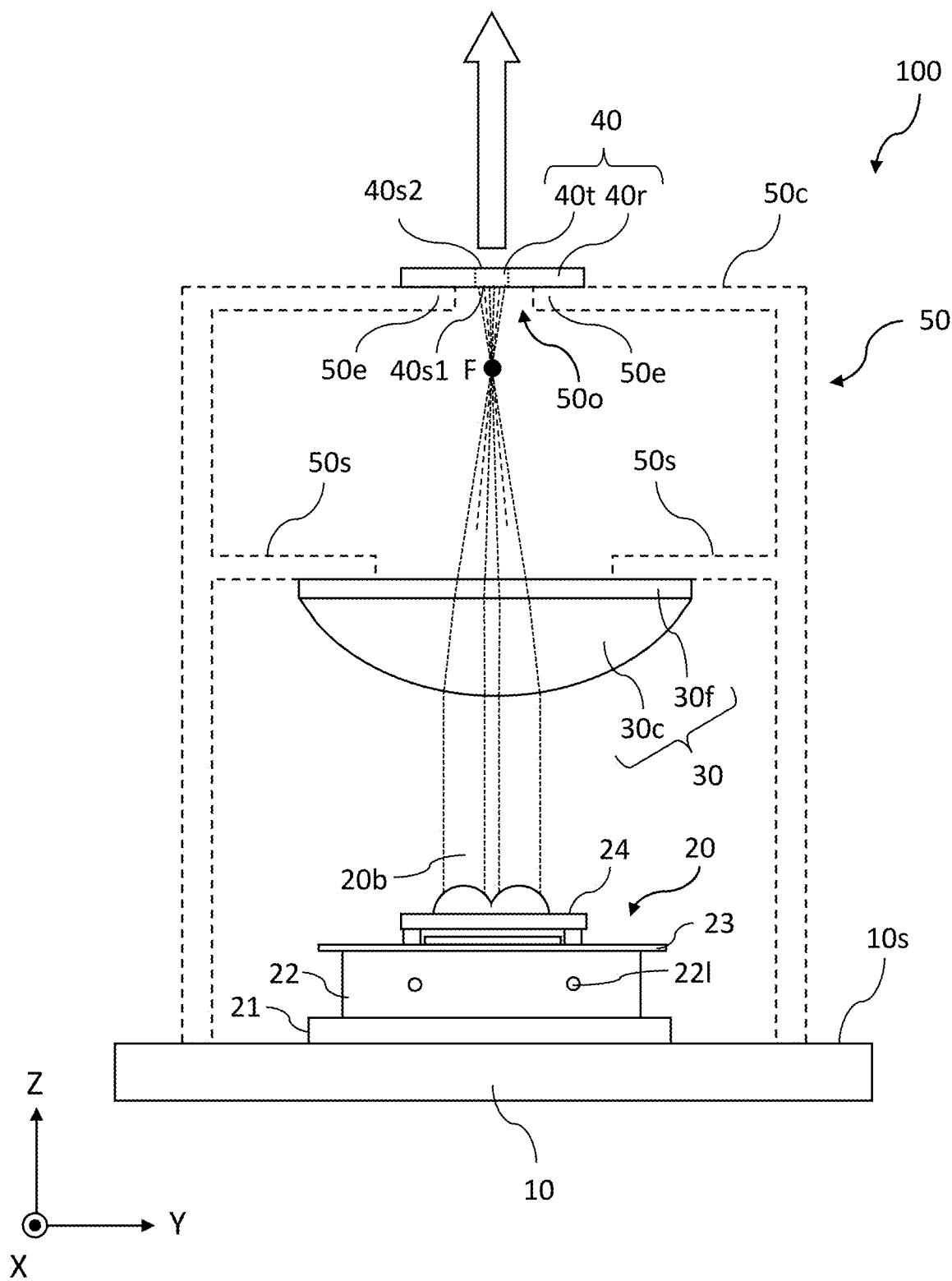
FIG. 3A is a side view schematically showing, as viewed along the X direction, how collimated beams emitted from a light source may be converged by an aspherical lens and be incident on the light-incident surface of the transmissive region of the wavelength-converting portion.
Figure 3B:
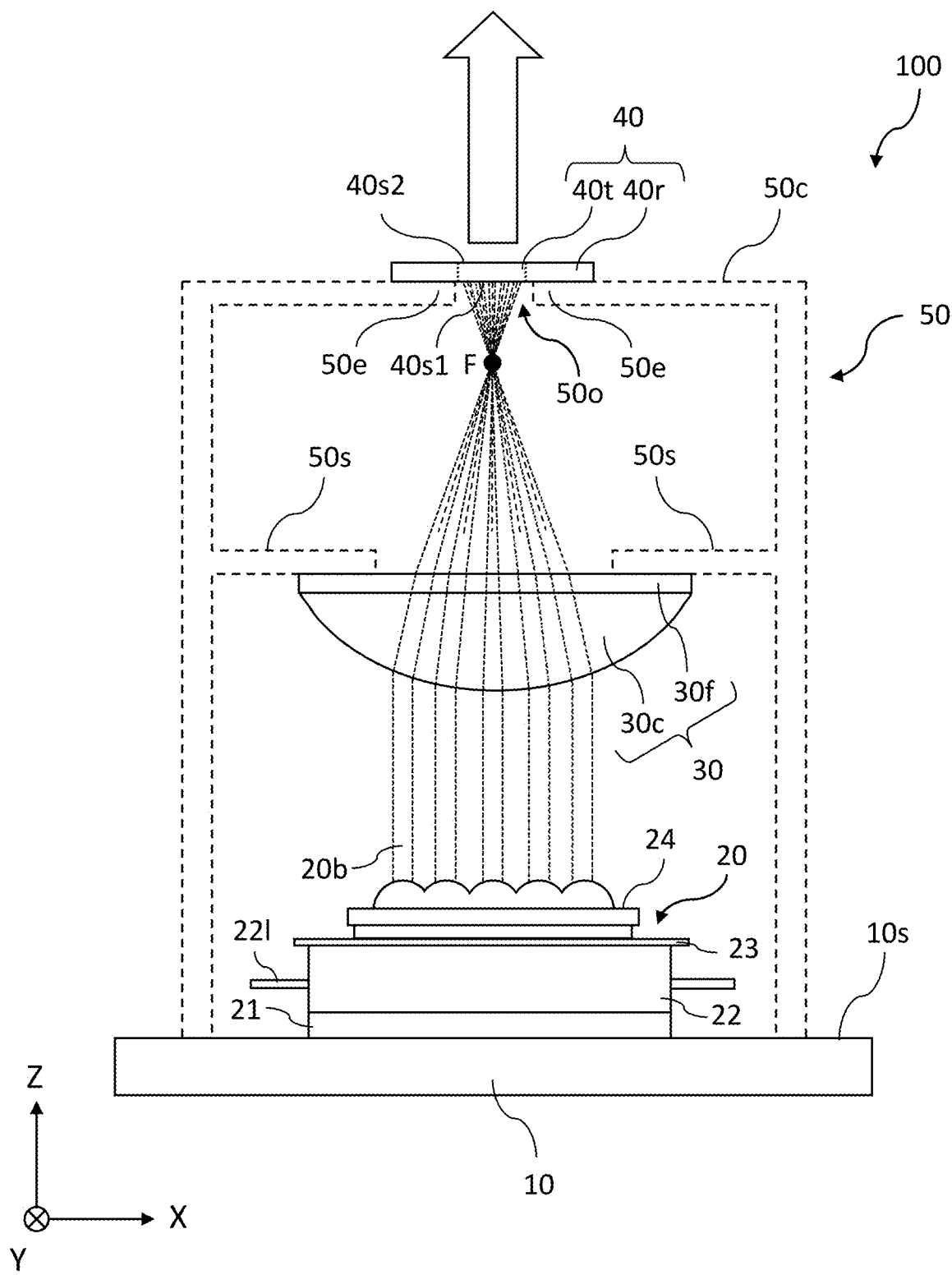
FIG. 3B is a side view schematically showing, as viewed along the Y direction, how collimated beams emitted from the light source may be converged by the aspherical lens and be incident on the light-incident surface of the transmissive region of the wavelength-converting portion.

Next, FIG. 3A and FIG. 3B will be described. FIG. 3A and FIG. 3B are side views schematically showing how collimated beams 20b emitted from the light source 20 may be converged by the aspherical lens 30 to be incident on the light-incident surface 40s1 of the transmissive region 40t of the wavelength-converting portion 40, as viewed along the X direction and the Y direction, respectively. In FIG. 3A and FIG. 3B, for ease of explanation, the housing 50 is partly illustrated by broken lines. A lid 50c of the housing 50 has a throughhole 50o through which the plurality of collimated beams 20b having been converged by the aspherical lens 30 are allowed to pass, and supports the wavelength-converting portion 40. The wavelength-converting portion 40 is supported by an edge 50e of the throughhole 50o. A support 50s, which is a part of the housing 50, protrudes inward from the sidewall portion, and supports the aspherical lens 30. A portion of the plate portion 30f of the aspherical lens 30 is bonded to the support 50s. Each region that is interposed between a pair of thin broken lines represents the beam width of a collimated beam 20b. As shown in FIG. 3A, the beam width of each collimated beam 20b is broader along the column direction (the Y direction), and, as shown in FIG. 3B, the beam width of each collimated beam 20b is narrower along the row direction (the X direction). The reason for this will be described later. A blank arrow represents mixed light into which the collimated beams 20b transmitted through the transmissive region 40t and the fluorescence emitted from the phosphor contained in the transmissive region 40t are combined.

In the example of FIG. 3A and FIG. 3B, two and five (respectively) collimated beams 20b are shown to be converged by the aspherical lens 30 and incident on the light-incident surface 40s1 of the transmissive region 40t. The optical axis of each collimated beam 20b is partly visualized, with a more sparse broken line than the broken lines representing the beam width of the collimated beam 20b. A focusing point F of the aspherical lens 30 corresponds to a point at which the optical axes of the plurality of collimated beams 20b would ideally converge. However, in practice, the plurality of collimated beams 20b may become deviated in position, or the plurality of collimated beams 20b may have non-equal beam diameters; therefore, not necessary all collimated beams 20b may actually converge at a single point. Even if there is no deviation in position, and the beam diameters are all equal, the diffraction limit of light will not allow all collimated beams 20b to converge at a point with zero width; therefore, it may be assumed that not all collimated beams 20b will converge at a single point as illustrated. Nonetheless, for ease of explanation, the focusing point F is simply illustrated as a single point in the present specification.

As shown in FIG. 3A and FIG. 3B, the light-incident surface 40s1 of the transmissive region 40t is disposed orthogonal to the optical axis of the aspherical lens 30, and is located off the focusing point F of the aspherical lens 30. The distance between the light-incident surface 40s1 of the transmissive region 40t and the focusing point F may be e.g. not less than 1 mm and not more than 20 mm. So long as the light-incident surface 40s1 of the transmissive region 40t intersects the optical axis of the aspherical lens 30, without a need for reflectors or the like to alter the traveling directions of the collimated beams 20b, the light-incident surface 40s1 of the transmissive region 40t can be irradiated with the plurality of collimated beams 20b having been converged. In the example shown in FIG. 3A and FIG. 3B, the focusing point F of the aspherical lens 30 is located between the aspherical lens 30 and the light-incident surface 40s1 of the transmissive region 40t. All of the plurality of collimated beams 20b diverging from the focusing point F are incident on the light-incident surface 40s1 of the transmissive region 40t, without being obstructed by the edge 50e of the throughhole 50o. The focusing point F may be located within the transmissive region 40t. In another example, the light-incident surface 40s1 of the transmissive region 40t may be located between the aspherical lens 30 and its focusing point F.

When the light-incident surface 40s1 of the transmissive region 40t is located off the focusing point F of the aspherical lens 30, the light-incident surface 40s1 can be irradiated with defocused collimated beams 20b. This allows the optical density of the collimated beams 20b at the light-incident surface 40s1 to be lower than in the case where the light-incident surface 40s1 of the transmissive region 40t is located at the focusing point F of the aspherical lens 30.

Convex Portion 30c of Aspherical Lens 30

Next, the aspheric shape of the surface of the convex portion 30c of the aspherical lens 30 will be described. The shape of the surface of the convex portion 30c can be defined by its conic constant. Given a conic constant k, and a curvature c=1/R at the lens vertex of the aspherical lens 30 (where R is the radius of curvature), coordinates (X, Y, Z)=(x, y, z) on the lens surface based on an origin that is the lens vertex of the aspherical lens 30 satisfy the following equation (1).

$$z = \frac{cr^2}{1+\sqrt{1-(1+k)c^2r^2}} + \sum_{i=2}^{n} a_{2i}r^{2i} \quad (1)$$

In the above equation, z represents a distance between an XY plane that contains the lens vertex and the lens surface along the Z direction; and $r=(x^2+y^2)^{1/2}$ represents a distance between the lens surface and the optical axis of the aspherical lens 30 on the XY plane. Furthermore, $a_{2i}(2i=2, \ldots, n)$ represents the aspheric coefficient.

First, the case where $a_{2i}=0$ will be described. In this case, equation (1) corresponds to one of the solutions to equation (2).

$$(1+k)z^2 - 2Rz + r^2 = 0 \quad (2)$$

Equation (2) indicates that, in the case where $a_{2i}=0$, equation (1) represents one of the following surfaces: a hyperboloid, a paraboloid, a sphere, and an ellipsoid.

Figure 4:
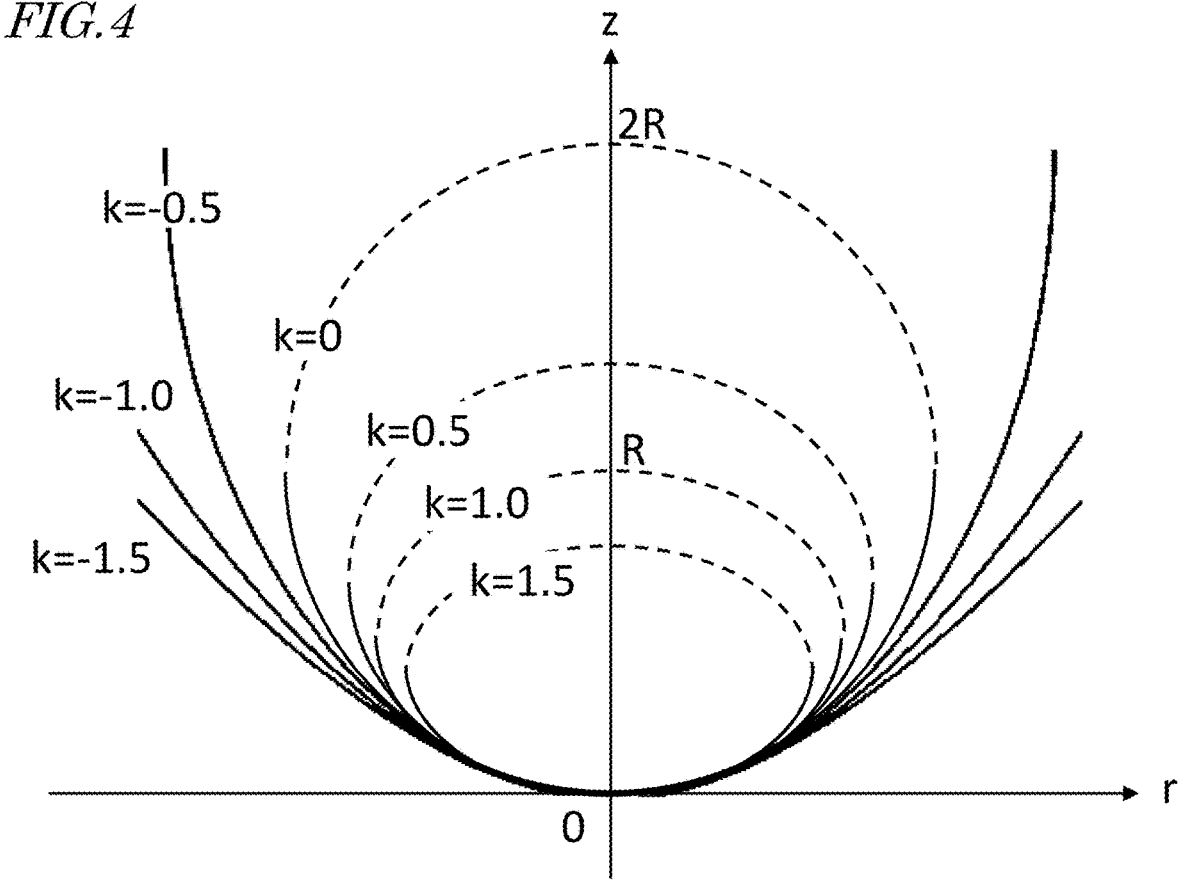
FIG. 4 is a graph in which lens surfaces according to equation (1) are plotted.

Next, FIG. 4 will be described. FIG. 4 is a graph in which lens surfaces according to equation (1) are plotted, in the case where $a_{2i}=0$. As the conic constant, values from k=−1.5 to k=+1.5 were chosen in increments of 0.5. Each solid line represents the mathematical function of equation (1), whereas broken lines represent portions of the mathematical function of equation (2) other than equation (1). The relationship between the conic constant k and the surfaces in the graph is as follows. The surfaces in the graph are: (k<−1) a hyperboloid; (k=−1) a paraboloid; (−1<k<0) an ellipsoid whose minor axis extends along the distance r and whose major axis extends along the Z direction; (k=0) a sphere; and (k>0) an ellipsoid whose major axis extends along the distance r and whose minor axis extends along the Z direction. As can be seen in regions where the distance r is large, the radius of curvature of each surface in the graph is: (k<0) greater than the radius of curvature R; (k=0) equal to the radius of curvature R; and (k>0) smaller than the radius of curvature R. The lens surface of the aspherical lens 30 may correspond to a surface in the graph that is represented by one of the solid lines around the origin. Note that the convex portion 30c of the aspherical lens 30 in the present embodiment may have any surface other than that defined by a conic constant k=0.

Figure 5:
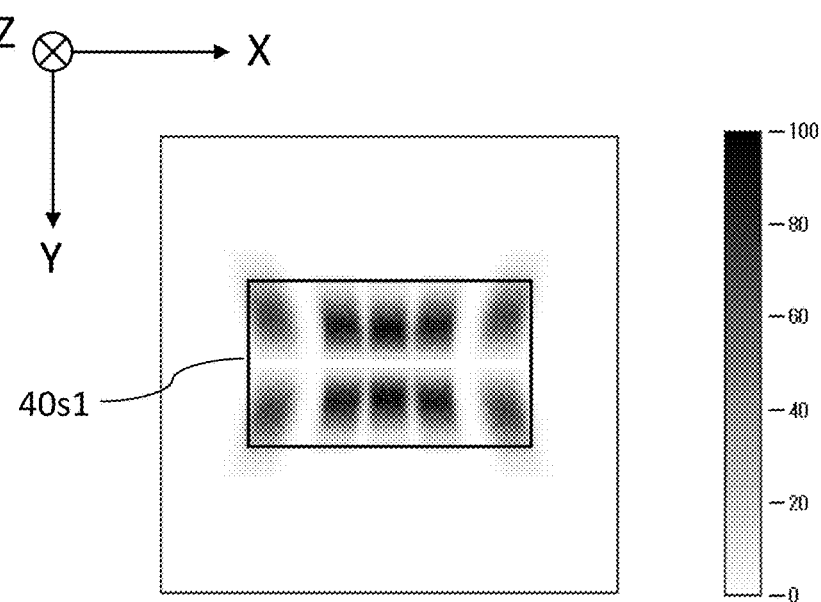
FIG. 5 is a diagram showing a result of intensity distribution calculation for two rows by five columns of radiated collimated beams converged by the aspherical lens, where the aspherical lens is defined by a conic constant $k=+0.5$.

Next, with reference to FIG. 5, effects that are obtained with the convex portion 30c of the aspherical lens 30 will be described. FIG. 5 is a diagram showing a result of intensity distribution calculation for two rows by five columns of radiated collimated beams converged by the convex portion 30c, where the convex portion 30c is defined by a conic constant k=+0.5. The calculation was conducted by using optical simulation software, OpticStudio, from Zemax LLC. The conditions of calculation were as follows; however, the present disclosure is not limited to light emission devices designed under the following conditions of calculation. The spot of each collimated beam 20b before being incident on the convex portion 30c has an ellipse shape on the XY plane, with a minor axis along the X direction of 1.0 mm and a major axis along the Y direction of 4.9 mm. The spot of each collimated beam 20b was defined with an intensity range that is equal to or greater than $1/e^2$ (where e is Napier's constant) times the peak intensity. The interval between centers of two adjacent collimated beams 20b along the row direction (the X direction) is 3.5 mm, and the interval between centers of two adjacent collimated beams 20b along the column direction (the Y direction) is 5.9 mm. The thickness of the aspherical lens 30 along the Z direction is 20 mm. The radius of curvature R at the origin of the convex portion 30c is 26.605 mm. The aspherical lens 30 has a refractive index n=1.52308, and there exists a refractive index n=1 around the aspherical lens 30. In the case where k=+0.5, the distance from the plate portion 30f of the aspherical lens 30 to the focusing point F is 36.2 mm. The distance between the light-incident surface 40s1 of the transmissive region 40t and the focusing point F of the aspherical lens 30 is 9.8 mm. The focusing point F is located between the light-incident surface 40s1 of the transmissive region 40t and the aspherical lens 30.

It can be seen from FIG. 5 that four radiated collimated beams at the ends of the row direction (the X direction) have intensity distributions that are elongated toward the respective four corners of the rectangular shape of the light-incident surface 40s1 of the transmissive region 40t. Thus, the plurality of collimated beams 20b include at least one pair of outer collimated beams that are radiated toward the corners of the light-incident surface 40s1, and one or more inner collimated beams interposed between the outer collimated beams. The aspherical lens 30 exerts less collecting power for the radiated collimated beams 20b than does a spherical lens, which would result in an intensity distribution as shown in FIG. 1B. In other words, the aspherical lens 30 is shaped so as to cause the outer collimated beams to be more diverged than the inner collimated beam(s). As described earlier, there is a greater proportion of fluorescence at the end portions, in particular the four corners, of the transmissive region 40t, owing to reflection at the reflective region 40r. Allowing the intensity distribution of radiated collimated beams to become more dispersed at the end portions of the light-incident surface 40s1 of the transmissive region 40t, in particular the four corners, introduces greater proportions of collimated beams 20b at such portions than in the case where no such dispersion is made. As a result of this, the hue of the light emitted from the end portions of the light-outgoing surface 40s2 of the transmissive region 40t, in particular the four corners, can be made closer to the hue of the light emitted from the central portion of the light-outgoing surface 40s2. This allows for reduction of color unevenness in the mixed light emitted from the light-outgoing surface 40s2 of the transmissive region 40t. The degree of divergence of outer collimated beams may be such that, regarding the beam width along the diverging direction, each outer collimated beam has a beam width that is equal to or greater than 1.1 times the beam width of each inner collimated beam, and preferably 1.3 times the beam width of each inner collimated beam. This allows for a further reduction in color unevenness. Moreover, since the outer collimated beams decrease in optical density as they become more diverged, their degree of divergence may be such that each outer collimated beam has a beam width that is equal to or less than 2.5 times the beam width of each inner collimated beam. A beam width along the diverging direction refers to a beam width along the major axis of each substantially ellipse-shaped beam, for example. More preferably, the inner collimated beam to serve as a reference for beam width comparison is chosen to be the collimated beam that is the closest, among the plurality of collimated beams 20b, to the center of the aspherical lens when passing through the aspherical lens.

Figure 6:
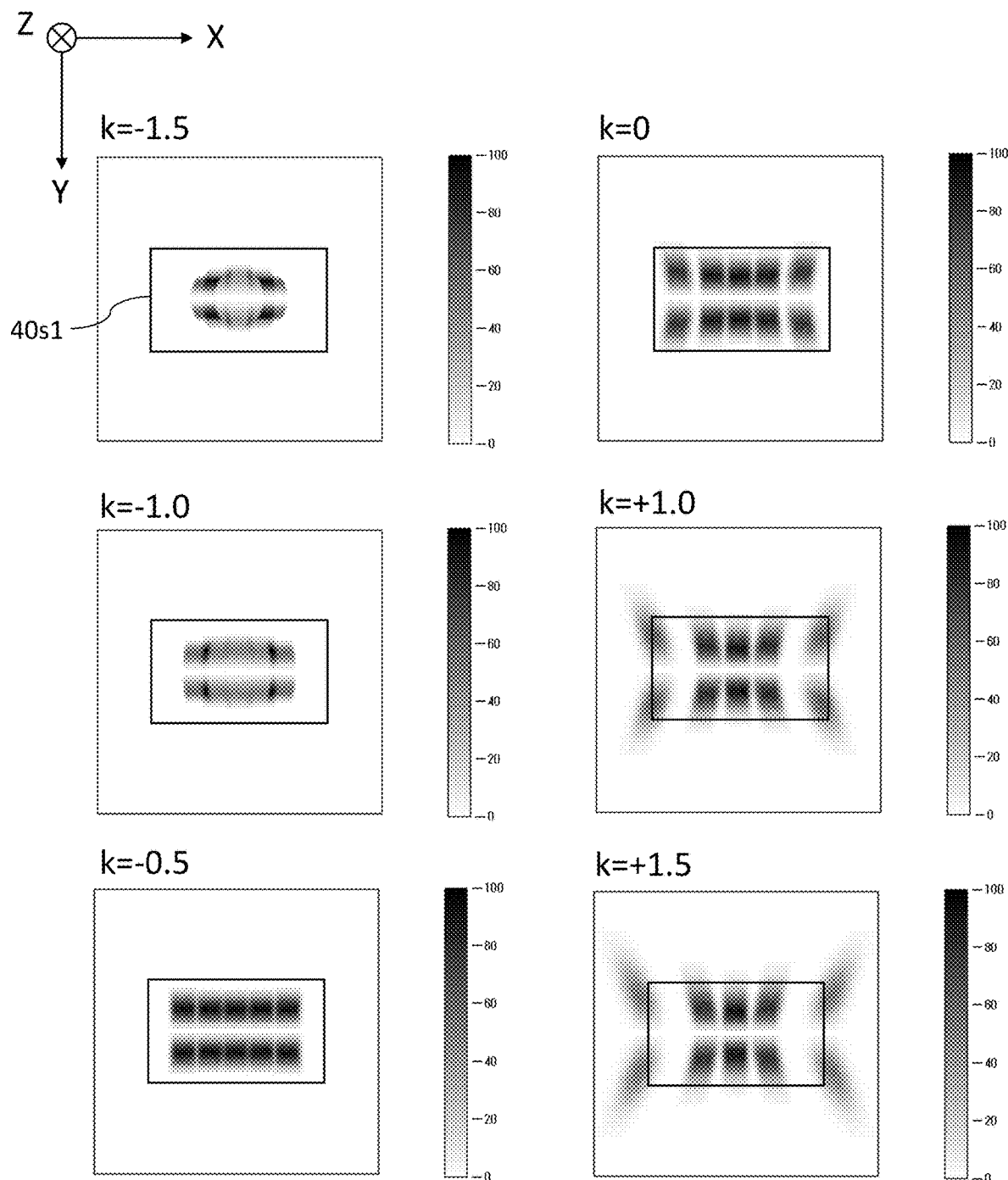
FIG. 6 is a diagram showing a result of intensity distribution calculation for two rows by five columns of radiated collimated beams that are converged by lenses of various conic constants.

Next, with reference to FIG. 6, the relationship between the conic constant k of the lens and the intensity distribution of radiated collimated beams will be described. FIG. 6 is a diagram showing a result of intensity distribution calculation for two rows by five columns of radiated collimated beams that are converged by lenses of various conic constants. As values of the conic constant, k=−1.5 (hyperboloid), k=−1.0 (paraboloid), k=−0.5 (ellipsoid), k=0 (sphere), k=+1.0 (ellipsoid), and k=+1.5 (ellipsoid) were chosen. Relative to the conic constant k=0 (sphere), the intensity distribution of radiated collimated beams becomes more concentrated at the central portion of the light-incident surface 40s1 of the transmissive region 40t as the conic constant value decreases while being negative (k<0), and becomes more dispersed at the end portions of the light-incident surface 40s1 of the transmissive region 40t, in particular the four corners, as the conic constant increases while being positive (k>0). In the present disclosure, the conic constant k of the aspherical lens 30 is chosen in the range of −15<k<0, or in the range of 0<k<+6.

The above example illustrates that the shape of the surface of the convex portion 30c of the aspherical lens 30 is designed by varying the conic constant k. Alternatively, the surface of the convex portion 30c may be designed by varying at least one of: the conic constant k, the curvature c, and the aspheric coefficient $a_{2i}$.

Two representative methods may exist for modulating the intensity distribution of radiated collimated beams. One method involves using a spherical lens to converge a plurality of collimated beams 20b that are arranged so that at least one center-to-center distance between them differs from any other center-to-center distance. The other method involves using the aspherical lens 30 to converge a plurality of collimated beams 20b that are arranged at a constant pitch as in the present disclosure. According to an analysis by the inventors, the latter allows the light source 20, and hence the aspherical lens 30, to be smaller in size, whereby the light emission device 100 can become more reduced in size.

Alternatively, the light emission device 100 can also be reduced in size by configuring the light source 20 so that a plurality of semiconductor light-emitting elements 25 are mounted within one package. The reason is that, as compared to the case where the light source 20 is implemented in a plurality of packages and the minimum distance between collimated beams 20b that are emitted from two adjacent packages needs to be reduced, it is easier to reduce the minimum distance between collimated beams 20b that are emitted from two adjacent semiconductor light-emitting elements 25 within a single package. That is, when the plurality of semiconductor light-emitting elements 25 are mounted within a single package, the range to be irradiated by the plurality of collimated beams 20b can be smaller than in the case where just as many semiconductor light-emitting elements 25 are divided among a plurality of packages. This allows the aspherical lens 30 to be smaller in size, and the light emission device 100 to be further reduced in size.

A desirable intensity distribution of radiated collimated beams may be determined based on the shape of the light-incident surface 40s1 of the transmissive region 40t. Therefore, the aspheric shape of the surface of the convex portion 30c of the aspherical lens 30 may be appropriately designed in accordance with the shape of the light-incident surface 40s1 of the transmissive region 40t. For example, in the case where the light-incident surface 40s1 of the transmissive region 40t has a circle shape, an ellipse shape, or an oval shape, it may be possible to reduce color unevenness in the mixed light by using an aspherical lens 30 whose convex portion 30c has a negative conic constant (k<0). An oval shape refers to a shape, resembling a circle or an ellipse, that is constituted by a non-intersecting closed curve and that is axisymmetric with respect to at least one location. The result shown in FIG. 6 indicates, in the case where the collimated beams 20b are disposed in rows and columns, a tendency that the four corners of the shape of rows and columns presented by the collimated beams 20b are more contracted toward the central portion as a negative conic constant (k<0) has a greater absolute value. FIG. 6 also indicates a tendency that, as a positive conic constant (k>0) has a greater absolute value, the four corners of the shape of rows and columns presented by the collimated beams 20b are more distant from the central portion. When the light-incident surface 40s1 of the transmissive region 40t has a circle shape, an ellipse shape, or an oval shape, for example, the surface of the convex portion 30c may have an aspheric shape defined by a surface whose conic constant is equal to or less than −1.0 (k≤1.0). When the light-incident surface 40s1 of the transmissive region 40t has a rectangular shape, for example, the surface of the convex portion 30c may have an aspheric shape defined by a surface whose conic constant is equal to or greater than 0.5 (k≥0.5).

Other than varying the aspheric shape of the surface of the convex portion 30c of the aspherical lens 30, the intensity distribution of radiated collimated beams may be modulated by varying the distance between the light-incident surface 40s1 of the transmissive region 40t and the focusing point F of the aspherical lens 30.

Example Configuration Inside Light Source 20

Figure 7A:
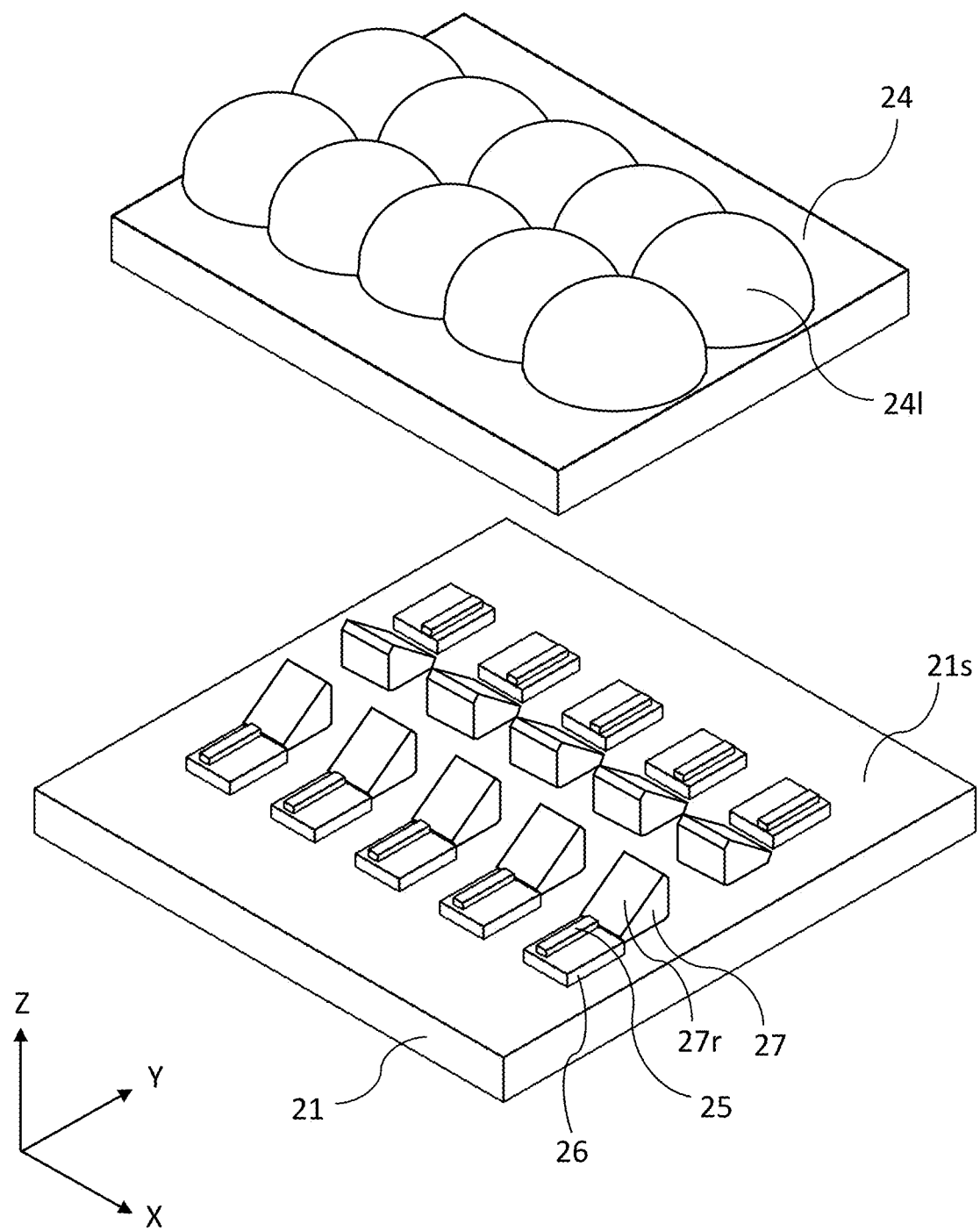
FIG. 7A is a diagram showing the light source in FIG. 2B, in which a frame body and a lid are omitted from illustration.

Next, with reference to FIG. 7A, an example configuration inside the light source 20 will be described. FIG. 7A is a diagram showing the light source 20 in FIG. 2B, in which the frame body 22 and the lid 23 are omitted from illustration. For ease of explanation, the distance between the base part 21 and the optical element 24 is exaggerated.

On the principal face 21s of the base part 21, the semiconductor light-emitting elements 25 are disposed in two rows by five columns via submounts 26. The emission end faces of the semiconductor light-emitting elements 25 in one row are opposed to the emission end faces of the semiconductor light-emitting elements 25 in the other row. Thus, the plurality of semiconductor light-emitting elements 25 are arranged in one or more rows and two or more columns or in two or more rows and one or more columns, along a plane (the XY plane) that is perpendicular to the optical axis of the aspherical lens 30. Each submount 26 is able to adjust the height of the corresponding semiconductor light-emitting element 25 along the Z direction. The center-to-center distance between adjacent semiconductor light-emitting elements 25 may be e.g. 0.85 mm or more. This can reduce the mutual influences of heat generated by the semiconductor light-emitting elements 25. On the other hand, from a standpoint of reducing the size of the light source 20, the center-to-center distance between adjacent semiconductor light-emitting elements 25 may preferably be 2.5 mm or less, for example. Although the example of FIG. 7A illustrates that the plurality of semiconductor light-emitting elements 25 are disposed at a constant pitch along the row direction, and a constant pitch along the column direction, these pitches may not be constant. As described above, it is possible to modulate the intensity distribution of radiated collimated beams by adjusting the center-to-center distance between adjacent semiconductor light-emitting elements 25. Possible placements of the plurality of semiconductor light-emitting elements 25 include a one-row placement and a placement of multiple rows and multiple columns.

On the principal face 21s of the base part 21, light-reflective members 27 are disposed in two rows by five columns. The reflective surface 27r, provided on a slope of each light-reflective member 27, is a surface that faces the emission end face of the corresponding semiconductor light-emitting element 25 and that reflects light emitted from the semiconductor light-emitting element 25. The angle between the reflective surface 27r of the light-reflective member 27 and the principal face 21s of the base part 21 is determined by the relative positioning between the semiconductor light-emitting element 25 and the optical element 24. Although the example shown in FIG. 7A illustrates this angle to be 45 degrees, it may alternatively be any angle other than 45 degrees. Light that is emitted from the two rows of semiconductor light-emitting elements 25 is reflected by the reflective surfaces 27r of the light-reflective members 27 in a direction away from the principal face 21s of the base part 21, so as to be incident on the optical element 24. Regarding the two rows of semiconductor light-emitting elements 25, the semiconductor light-emitting elements 25 in one row emit light in the +Y direction, whereas the semiconductor light-emitting elements 25 in the other row emit light in the −Y direction. The +Y direction corresponds to the direction of an arrowhead shown in FIG. 7A, whereas the −Y direction corresponds to an opposite direction to the arrowhead.

The main material of each light-reflective member 27 may be: a glass, such as quartz or BK7 (borosilicate glass); a metal, such as aluminum; or Si, for example. The reflective surface 27r of each light-reflective member 27 is desirably made of a material having a relatively high reflectance with respect to the light emitted by the semiconductor light-emitting element 25. This material may be a metal or a multilayer film of dielectric. The light reflectance of the reflective surface 27r may be 70% or more, e.g. 90%, at the peak wavelength of the light emitted by the semiconductor light-emitting element 25, for example. The light-reflective member 27 may include a plurality of light reflective surfaces. The light source 20 may include an additional light-reflective member(s) other than the light-reflective members 27.

The optical element 24 includes collimating lenses 24l that are arranged in two rows by five columns. Each collimating lens 24l is disposed at a position where light emitted from the corresponding semiconductor light-emitting element 25 passes through that collimating lens 24l. The optical element 24 allows two rows by five columns of collimated beams to be emitted from the collimating lenses 24l arranged in two rows by five columns.

The collimating lenses 24l of the optical element 24 may be made of at least one of glass, quartz, sapphire, a transparent ceramic, and a plastic, for example. The sizes of the optical element 24 along the X direction and along the Y direction may be e.g. not less than 15 mm and not more than 20 mm, and the thickness of the optical element 24 along the Z direction may be e.g. not less than 2.0 mm and not more than 5.0 mm.

Note that the number and relative positioning of semiconductor light-emitting elements 25 are not limited to the number and relative positioning illustrated in FIG. 7A. There may be multiple semiconductor light-emitting elements 25. In order to allow for reducing the size of the light source 20, the number of semiconductor light-emitting elements 25 may be 30 or less, for example. The same is also true of the collimating lenses 24l in the optical element 24, and of the light-reflective members 27.

Each semiconductor light-emitting element 25 may be a laser diode, for example. The laser diode emits coherent light. The laser diode has a structure in which an n-side cladding layer, an active layer, and a p-side cladding layer are disposed in this order. The laser diode further includes an electrode (n-side electrode) located at the n-side cladding layer side, and an electrode (p-side electrode) located at the p-side cladding layer side. The electrodes may be made of a light-transmissive and electrically-conductive material, so as to be utilized as cladding layers. By applying voltage to the n-side electrode and the p-side electrode and causing a current equal to or greater than a threshold value to flow, laser light is emitted from the laser diode. In FIG. 7A, the laser light is emitted from an end face of each semiconductor light-emitting element 25 in a direction parallel to the Y direction. A spot created by the emitted laser light has a far field pattern of an ellipse shape whose major axis extends along the Z direction and whose minor axis extends along the X direction. The laser diode is able to emit laser light in any of the colors belonging in the visible region, for example. In the case where light outside of the visible region is to be utilized as a portion of the mixed light, the laser diodes may emit laser light other than that of the visible region, e.g., ultraviolet. Among the plurality of semiconductor light-emitting elements 25 shown in FIG. 7A, all may emit laser light of the same wavelength, or at least one may emit laser light of a different wavelength. In order to reduce color unevenness, it is preferable that light from all of the plurality of semiconductor light-emitting elements 25 is in the same color.

In the case where a YAG phosphor is used as the phosphor, laser diodes that emit blue laser light may be used, for example. The emission peak wavelength of blue light is desirably in a range of not less than 420 nm and not more than 480 nm, and more desirably in a range from 440 nm to 460 nm. Examples of laser diodes that emit blue laser light include semiconductor laser devices containing a nitride semiconductor. As nitride semiconductors, GaN, InGaN, and AlGaN can be used, for example. A semiconductor laser device containing a nitride semiconductor is able to emit light ranging from ultraviolet to the visible region by varying its composition.

As necessary, the semiconductor light-emitting element 25 may be hermetically sealed within a package. The base part 21, the frame body 22, and the lid 23 correspond to a package within which the semiconductor light-emitting elements 25 are hermetically sealed. Given that the semiconductor light-emitting elements 25 are laser diodes, the light source 20 can be referred to as a semiconductor laser package. In the case where the semiconductor light-emitting elements 25 are laser diodes that emit laser light of a relatively short wavelength (e.g. a wavelength of about 480 nm or less), if the emission end faces of the laser diodes are exposed to the atmospheric air, the ends faces may be subject to deterioration during operation, owing to dust collection effects and the like. Such an end face deterioration may result in a decrease in the optical output power of the laser diodes. In order to enhance reliability of the laser diodes and extend their life time, the laser diodes are desirably hermetically sealed.

Note that the semiconductor light-emitting elements 25 may include light-emitting diodes (LED), which emit incoherent light. Preferably, the semiconductor light-emitting elements 25 are laser diodes, because laser light will result in small losses of light when used in combination with a lens.

Similarly to the substrate 10 of the light emission device 100, the base part 21 is desirably made of a material having a relatively high thermal conductivity, in order to allow the heat emitted from the plurality of semiconductor light-emitting elements 25 to be quickly released to the outside. Similarly, the submounts 26 are desirably made of a material having a high thermal conductivity. Examples of the main material of the base part 21 include metals, such as Cu, and ceramics, such as aluminum nitride and carbon nitride. Examples of the main material of the submounts 26 include aluminum nitride, carbon nitride, and the like.

Each semiconductor light-emitting element 25 is bonded at is lower surface to an upper surface of the submount 26. Therefore, in the case where a side surface of the semiconductor light-emitting element 25 is the light-outgoing surface, the semiconductor light-emitting element 25 emits light in a direction parallel to the principal face 21s of the base part 21. For example, via an electrically conductive layer such as Au—Sn, each semiconductor light-emitting element 25 may be fixed to the submount 26 having a metal film provided thereon. Note that the semiconductor light-emitting element 25 may be provided so as to directly emit light along the Z direction, in which case the light-reflective member 27 is not needed. In regions of the submount 26 other than where the semiconductor light-emitting element 25 is provided, an electrically conductive layer for wire connection may be provided in order to facilitate electrical connection between the plurality of semiconductor light-emitting elements 25 and the lead terminals 22l of the frame body 22 via wires.

Figure 7B:
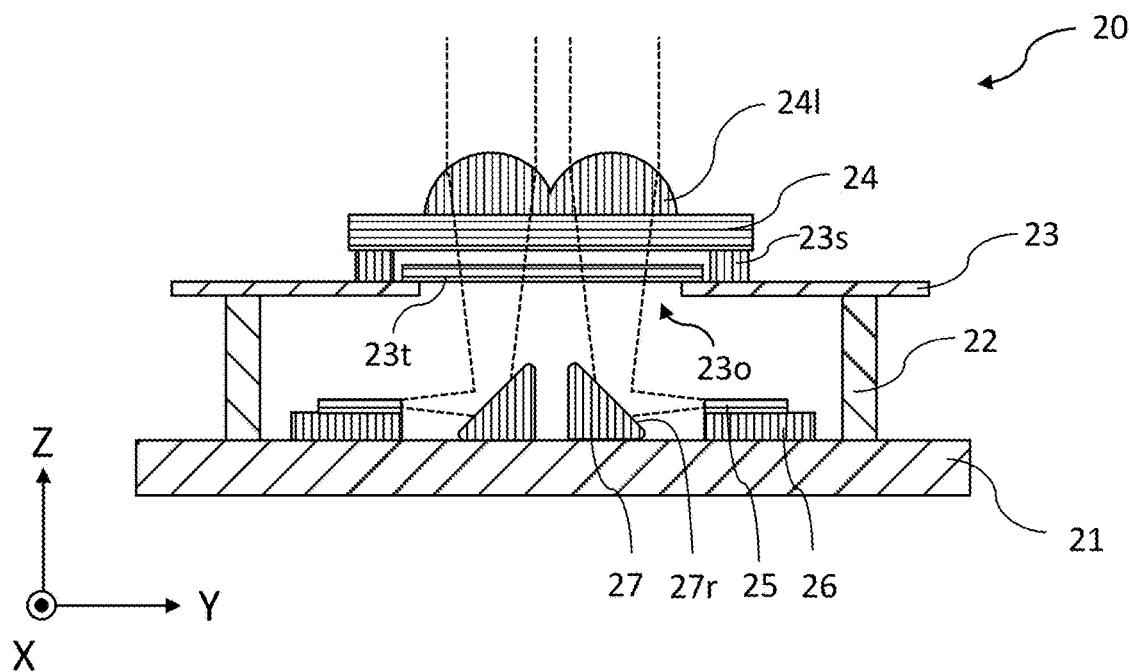
FIG. 7B is a cross-sectional view taken along the YZ plane, schematically showing how laser light emitted from the semiconductor light-emitting elements may be reflected by reflective surfaces of light-reflective members, and collimated by collimating lenses of an optical element.
Figure 7C:
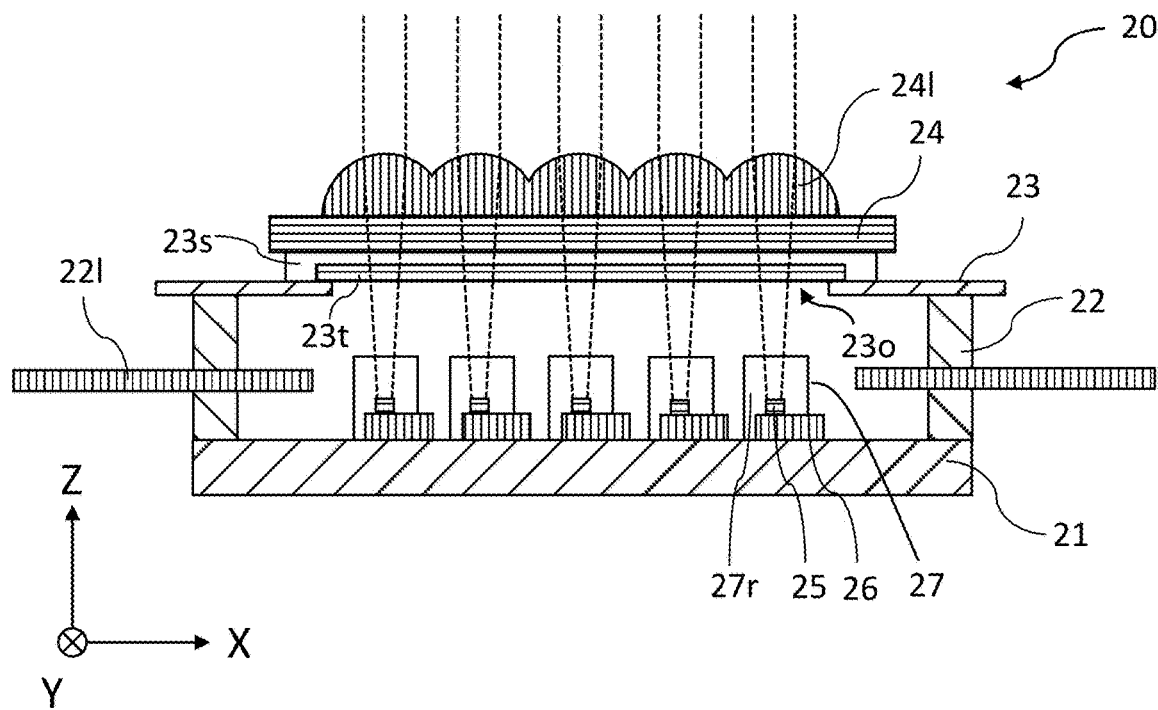
FIG. 7C is a cross-sectional view taken along the XZ plane, schematically showing how laser light emitted from the semiconductor light-emitting elements may be reflected by the reflective surfaces of the light-reflective members, and collimated by the collimating lenses of the optical element.

Next, with reference to FIG. 7B and FIG. 7C, the differing beam widths of the collimated beams 20b shown in FIG. 3A and FIG. 3B will be described. Herein, the semiconductor light-emitting elements 25 include laser diodes. FIG. 7B and FIG. 7C are cross-sectional views taken respectively along the YZ plane and along the XZ plane, schematically showing how laser light emitted from the semiconductor light-emitting elements 25 may be reflected by the reflective surfaces 27r of the light-reflective members 27, and collimated by the collimating lenses 24l of the optical element 24. The lid 23 includes a light-transmitting member 23t that closes an opening 23o, and spacers 23s that create an interspace between the light-transmitting member 23t and the optical element 24. As described above, the laser light that is emitted from each semiconductor light-emitting element 25 is divergent widely along the Z direction, but not very much along the X direction. Therefore, as shown in FIG. 7B, when laser light that is divergent widely along the Z direction is reflected upward and then collimated, the collimated beam 20b will have a broad beam width along the Y direction. On the other hand, as shown in FIG. 7C, when laser light that is not very divergent along the X direction is reflected upward and then collimated, the collimated beam 20b will not have a very broad beam width along the X direction. Therefore, a spot created by the collimated beam 20b emitted from the optical element 24 along the Z direction has an ellipse shape whose major axis extends along the Y direction and whose minor axis along the X direction in the XY plane. The far field pattern of laser light that is emitted from each semiconductor light-emitting element 25 is not limited to the shape described herein; however, the major axis and the minor axis may be reversed, for example.

Variations of Converging Portion Having an Aspheric Surface

Figure 8A:
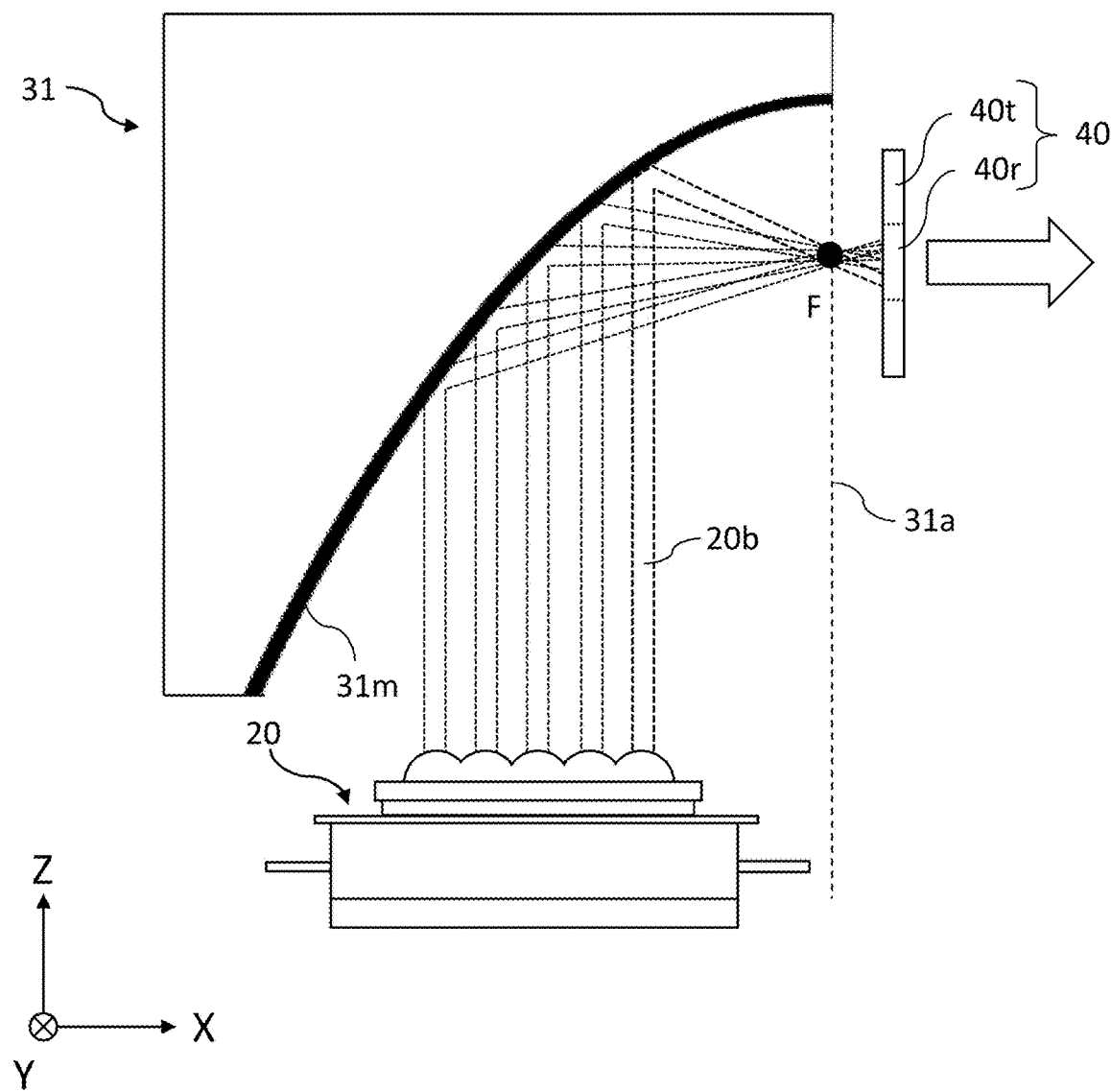
FIG. 8A is a side view schematically showing, as viewed along the Y direction, how collimated beams emitted from the light source may be converged by a paraboloid reflector according to a variation and be incident on the light-incident surface of the transmissive region of the wavelength-converting portion.
Figure 8B:
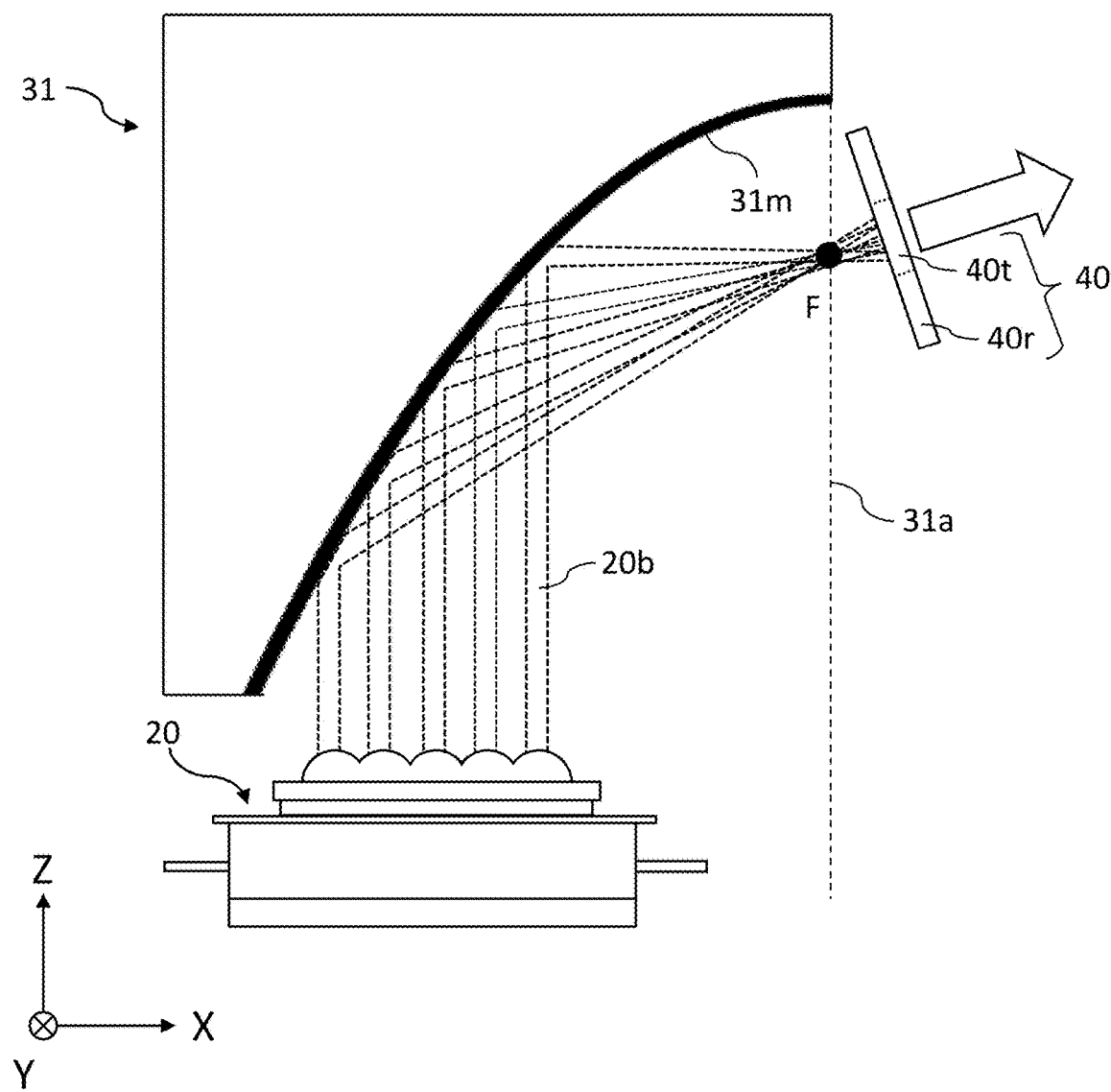
FIG. 8B is a side view schematically showing, as viewed along the Y direction, how collimated beams emitted from the light source may be converged by a paraboloid reflector according to another variation and be incident on the light-incident surface of the transmissive region of the wavelength-converting portion.

Next, with reference to FIG. 8A and FIG. 8B, variations of the converging portion having an aspheric surface according to the present disclosure will be described. FIG. 8A and FIG. 8B are side views schematically showing, as viewed along the Y direction, how collimated beams 20b emitted from the light source 20 may be converged by a paraboloid reflector 31 according to each variation and be incident on the light-incident surface 40s1 of the transmissive region 40t of the wavelength-converting portion 40. In FIG. 8A and FIG. 8B, the substrate 10 and the housing 50 are omitted from illustration. The paraboloid reflector 31 according to each variation has a reflective surface 31$m$ of a paraboloid shape. The reflective surface 31$m$ reflects light that travels in parallel to an axis 31$a$ of the paraboloid (the Z direction), so as to be converged onto a focusing point F on the axis 31$a$. Not all portions of the reflective surface 31$m$ shown in FIG. 8A and FIG. 8B are required; it suffices if the portions to be struck by the light exist. The shape of any portion other than the reflective surface 31$m$ of the paraboloid reflector 31 is not limited. In the examples shown in FIG. 8A and FIG. 8B, the light source 20 emits collimated beams 20$b$ arranged in two rows by five columns along the Z direction. Among the five collimated beams 20$b$ reflected by the reflective surface 31$m$ of the paraboloid reflector 31, it is the middle beam that the light-incident surface 40$s$1 of the transmissive region 40$t$ is perpendicular to the optical axis of.

In the example shown in FIG. 8A, the middle beam is reflected by the reflective surface 31$m$ along the X direction. Mixed light, which is represented by a blank arrow, is emitted from the light-outgoing surface 40$s$2 of the transmissive region 40$t$ along the X direction. In the example shown in FIG. 8B, the light source 20 is more distant from the axis 31$a$ than in the example shown in FIG. 8A. In the example shown in FIG. 8B, too, all of the collimated beams 20$b$ emitted from the light source 20 are converged onto the focusing point F. The middle beam is reflected in an obliquely upward direction by the reflective surface 31$m$. The mixed light is emitted in an obliquely upward direction from the light-outgoing surface 40$s$2 of the wavelength-converting portion 40. If the light source 20 were located closer to the axis 31$a$ than in the example of FIG. 8A, the mixed light would be emitted in an obliquely downward direction from the light-outgoing surface 40$s$2 of the wavelength-converting portion 40.

In the examples shown in FIG. 8A and FIG. 8B, the focusing point F is located between the paraboloid reflector 31 and the light-incident surface 40$s$1 of the transmissive region 40$t$; alternatively, the light-incident surface 40$s$1 of the transmissive region 40$t$ may be located between the paraboloid reflector 31 and the focusing point F. The focusing point F may be located inside the transmissive region 40$t$.

The reflective surface 31$m$ according to each of these variations does not need to have a paraboloid shape, but may have the shape of an aspheric surface such as a hyperboloid or an ellipsoid, depending on the intended use. Color unevenness in the mixed light can be reduced also when the converging portion having an aspheric surface according to the present disclosure is an aspheric surface reflector such as the paraboloid reflector 31.

Light emission devices according to embodiments of the present disclosure are applicable to various light sources, e.g., a lighting device, a headlight for vehicles such as an automobile, a light source of a projector, a light source for an endoscope, and so on.

What is claimed is:

1. A light emission device comprising:
   a plurality of semiconductor light-emitting elements;
   an optical element configured to collimate light emitted from each of the plurality of semiconductor light-emitting elements and output a plurality of collimated beams; and
   a paraboloid reflector configured to be irradiated with the plurality of collimated beams at a region avoiding a vertex of the paraboloid reflector, and to cause the plurality of collimated beams reflected by the paraboloid reflector to converge onto a focusing point, wherein:
   in a plane that is perpendicular to an axis of a paraboloid of the paraboloid reflector and includes the focusing point, a reflective surface of the paraboloid reflector forms a single curved line.

2. The light emission device of claim 1, wherein the plurality of collimated beams output from the optical element are parallel to one another.

3. The light emission device of claim 1, wherein the plurality of semiconductor light-emitting elements are arranged in one or more rows and two or more columns or in two or more rows and one or more columns.

4. The light emission device of claim 1, further comprising:
   a housing in which the plurality of semiconductor light-emitting elements, the optical element, and the paraboloid reflector are housed.

5. The light emission device of claim 4, wherein the housing comprises a sidewall portion and a support that protrudes inward from the sidewall portion and supports the paraboloid reflector.

6. The light emission device of claim 1, wherein the semiconductor light-emitting elements are laser diodes.

7. The light emission device of claim 6, further comprising a package in which the plurality of laser diodes are hermetically sealed.

8. A light emission device comprising:
   a plurality of semiconductor light-emitting elements;
   an optical element configured to collimate light emitted from each of the plurality of semiconductor light-emitting elements and output a plurality of collimated beams; and
   a reflector having a shape of an aspheric surface configured to be irradiated with the plurality of collimated beams at a region avoiding a vertex of the reflector, and to cause the plurality of collimated beams reflected by the reflector to converge onto a focusing point, wherein:
   in a plane perpendicular to a line that connects the vertex and the focusing point, the plane including the focusing point, a reflective surface of the reflector forms a single curved line.

9. The light emission device of claim 8, wherein the plurality of collimated beams output from the optical element are parallel to one another.

10. The light emission device of claim 8, wherein the plurality of semiconductor light-emitting elements are arranged in one or more rows and two or more columns or in two or more rows and one or more columns.

11. The light emission device of claim 8, further comprising:
    a housing in which the plurality of semiconductor light-emitting elements, the optical element, and the reflector are housed.

12. The light emission device of claim 11, wherein the housing comprises a sidewall portion and a support that protrudes inward from the sidewall portion and supports the reflector.

13. The light emission device of claim 8, wherein the semiconductor light-emitting elements are laser diodes.

14. The light emission device of claim 13, further comprising a package in which the plurality of laser diodes are hermetically sealed.

* * * * *

UNITED STATES PATENT AND TRADEMARK OFFICE
CERTIFICATE OF CORRECTION

PATENT NO. : 12,348,001 B2
APPLICATION NO. : 18/333693
DATED : July 1, 2025
INVENTOR(S) : Akinori Hara and Toshiaki Yamashita It is certified that error appears in the above-identified patent and that said Letters Patent is hereby corrected as shown below:

On the Title Page

Related U.S. application data in item (63):
Please delete:
"Continuation of application No. 17/883,243, filed on Aug. 8, 2022, now Pat. No. 11,721,950, which is a continuation-in-part of application No. 17/016,202, filed on Sep. 9, 2020, now Pat. No. 11,444,430."

Please replace with:
"Continuation of application No. 17/883,243, filed on Aug. 8, 2022, now Pat. No. 11,721,950, which is a continuation of application No. 17/016,202, filed on Sep. 9, 2020, now Pat. No. 11,444,430."

Signed and Sealed this
Sixteenth Day of September, 2025

Coke Morgan Stewart
*Acting Director of the United States Patent and Trademark Office*